(12) United States Patent
Kim

(10) Patent No.: US 7,961,009 B2
(45) Date of Patent: Jun. 14, 2011

(54) DOMINO LOGIC BLOCK HAVING DATA HOLDING FUNCTION AND DOMINO LOGIC INCLUDING THE DOMINO LOGIC BLOCK

(75) Inventor: Min-Su Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/708,882

(22) Filed: Feb. 19, 2010

(65) Prior Publication Data

US 2010/0213981 A1    Aug. 26, 2010

(30) Foreign Application Priority Data

Feb. 23, 2009  (KR) .................... 10-2009-0014951

(51) Int. Cl.
*H03K 19/096* (2006.01)
*H03K 19/094* (2006.01)

(52) U.S. Cl. ............. 326/95; 326/98; 326/119; 327/212
(58) Field of Classification Search .............. 326/95–98, 326/112, 119; 327/211, 212
See application file for complete search history.

(56) References Cited

U.S. PATENT DOCUMENTS

| | | | | |
|---|---|---|---|---|
| 5,828,234 A | * | 10/1998 | Sprague | 326/98 |
| 6,968,475 B2 | * | 11/2005 | Rosen | 713/500 |
| 7,212,039 B2 | * | 5/2007 | Qureshi et al. | 326/98 |

FOREIGN PATENT DOCUMENTS

| | | |
|---|---|---|
| JP | 2000-278114 | 10/2000 |
| JP | 2001-196919 | 7/2001 |
| KR | 20050118352 | 12/2005 |
| KR | 20060002551 | 1/2006 |

* cited by examiner

*Primary Examiner* — Daniel D Chang
(74) *Attorney, Agent, or Firm* — Stanzione & Kim, LLP

(57) ABSTRACT

The domino logic of the general inventive concept receives a feedback signal and an input signal and outputs any one of the feedback signal and the input signal as an output signal in response to an enable signal and a clock signal. The feedback signal is an output signal of a previous cycle of a clock signal. When an enable signal is a first level, the domino logic maintains an output signal of a previous cycle instead of an input signal. According to the present general inventive concept, the domino logic having a data hold function can be embodied.

35 Claims, 7 Drawing Sheets

DOMINO LOGIC BLOCK HAVING DATA HOLDING FUNCTION AND DOMINO LOGIC INCLUDING THE DOMINO LOGIC BLOCK

CROSS-REFERENCE TO RELATED APPLICATIONS

This U.S. non-provisional patent application claims priority under 35 U.S.C. §119 of Korean Patent Application No. 10-2009-0014951, filed on Feb. 23, 2009, the entire contents of which are hereby incorporated by reference.

BACKGROUND

1. Field of the Invention

The present disclosure herein relates to digital signal processing, and more particularly, to domino logic using logic block.

2. Description of the Related Art

Domino logic is widely used to reduce the size and power consumption of a circuit in an integrated circuit. In domino logic, a standard cell is represented by a stage and is comprised of a plurality of transistors. A plurality of stages is serially connected to one another to form domino logic.

For example, multi-input AND function or multi-input OR function may be embodied using domino logic. In a case of multi-input AND function, two-input AND function may be embodied in a single stage. If a plurality of stages is serially connected to one another, a multi-input AND function may be embodied. If a signal inputted to a first stage is evaluated, the first stage propagates an output to a second stage and the second stage propagates an output to a third stage.

A useful feature of domino logic is that a signal is propagated through various stages without clocks assigned to each stage. Thus, an input signal can be propagated through a plurality of cascade stages in one clock cycle.

An output of each stage that is propagated into a next stage must be held when utilizing domino logic.

SUMMARY

The present general inventive concept provides a domino logic circuit including a slow MUX input and an output latch function.

Additional features and utilities of the present general inventive concept will be set forth in part in the description which follows and, in part, will be obvious from the description, or may be learned by practice of the general inventive concept.

Features and/or utilities of the present general inventive concept may be realized by a domino logic block including a pre-charge circuit and an evaluation circuit. The pre-charge circuit may pre-charge a first node in response to a clock signal, an enable signal, and a feedback signal and may selectively discharge a second node. The evaluation circuit may be connected between the first node and the second node and may propagate any one of a signal of the first node and an input signal as an output signal in response to the clock signal and the enable signal.

Features and/or utilities of the present general inventive concept may also be realized by a domino logic circuit including a plurality of domino logic blocks sequentially connected to one another. At least one of the plurality of domino logic blocks may receive a clock signal, an enable signal, and a feedback signal, may pre-charge a first node in response to the clock signal and the enable signal and includes a pre-charge circuit to propagate the feedback signal to a second node and an evaluation circuit to propagate any one of an input signal and the feedback signal propagated to the second node as an output signal in response to the clock signal and the enable signal.

Features and/or utilities of the present general inventive concept may also be realized by a logic block including a pseudo-multiplexing logic block to receive a feedback signal and an input signal and to output any one of the feedback signal and the input signal as an output signal in response to an enable signal and a clock signal. The pseudo-multiplexing logic block may include a pre-charge circuit to receive the clock signal, the enable signal and the feedback signal, to pre-charge a first node and to propagate the feedback signal to a second node in response to the clock signal and the enable signal, and an evaluation circuit to propagate any one of the input signal and the feedback signal propagated to the second node as an output signal in response to the clock signal and the enable signal.

Features and/or utilities of the present general inventive concept may also be realized by a domino logic block including a pre-charge circuit to pre-charge a first electrical node and to discharge a second electrical node in response to a clock signal, an enable signal, and a first input signal, and an evaluation circuit including a first transistor connected in parallel to a logic unit between the first electrical node and the second electrical node. The evaluation circuit may output an output signal corresponding to one of the first input signal and a second input signal, and the output signal of the evaluation circuit may be based on the clock signal and the enable signal. The first transistor may receive the enable signal as a gate input signal, and the logic unit may receive the second input signal as an input.

The logic unit may include at least one transistor, and the second input signal may be connected to a gate of the at least one transistor.

The first input signal may be a feedback signal corresponding to a signal of the first electrical node.

The pre-charge circuit may include a first logic circuit to receive the enable signal and the first input signal, a latch circuit to latch an output of the first logic circuit in response to the clock signal, a second logic circuit to receive the clock signal and an output of the latch circuit, a second transistor to pre-charge the first electrical node in response to an output of the second logic circuit, and a third transistor to discharge the second electrical node in response to the output of the second logic circuit.

The first logic circuit may include a NAND gate and the second logic circuit may include an AND gate.

The latch circuit may latch the output of the first logic circuit when the clock signal is a low level, the second transistor may be a PMOS transistor, and the third transistor may be an NMOS transistor.

The evaluation circuit may include a latch circuit to latch the enable signal in response to the clock signal, the first transistor connected to an output of the latch circuit to receive the latched enable signal, the logic unit, and an inverter to receive a signal of the first electrical node and to output the domino logic block output signal.

The latch circuit may latch the enable signal when the clock signal is a low level, and the first transistor may be an NMOS transistor.

The second input signal may include at least two second input signals, and the logic unit may include a logic combination circuit to perform a logic function on the at least two second input signals.

The domino logic block may further include a feedback circuit to output a signal of the first electrical node of a previous cycle of the clock signal as the first input signal. The feedback circuit may include a latch circuit to latch the signal of the first electrical node. The latch circuit may latch the signal of the first electrical node in response to the clock signal and may output the latched signal as the first input signal. The feedback circuit may include a buffer circuit connected to the output of the latch circuit to delay the signal output from the latch circuit.

Features and/or utilities of the present general inventive concept may also be realized by a domino logic circuit including a plurality of domino logic blocks sequentially connected to one another. At least one of the plurality of domino logic blocks may include a pre-charge circuit to pre-charge a first electrical node and to discharge a second electrical node in response to a clock signal, an enable signal, and a first input signal, and an evaluation circuit including a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal.

The first transistor may receive the enable signal as a gate input signal, and the logic unit may receive the second input signal as an input.

The second input signal may include the output signal of another domino logic block of the plurality of domino logic blocks.

The first input signal may be a feedback signal corresponding to a signal of the first electrical node of a previous cycle of the clock signal.

Features and/or utilities of the present general inventive concept may be realized by a system-on-chip, including a CPU core, supporting logic, and memory. At least one of the CPU core, the supporting logic, and the memory may include a domino logic circuit, including a pre-charge circuit to pre-charge a first electrical node and to discharge a second electrical node in response to a clock signal, an enable signal, and a first input signal, and an evaluation circuit including a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal. The first transistor may receive the enable signal as a gate input signal, and the logic unit may receive the second input signal as an input.

According to one embodiment, only the CPU core includes the domino logic circuit.

Features and/or utilities of the present general inventive concept may be realized by a method of selectively outputting a signal from a domino logic circuit, the method including pre-charging a first electrical node and discharging a second electrical node in response to a clock signal, an enable signal, and a first input signal, inputting the clock signal, the enable signal, and a second input signal into an evaluation circuit, and based on the clock signal and the enable signal, outputting from the evaluation circuit a signal corresponding to one of the first input signal and the second input signal.

The evaluation circuit may include a first transistor connected in parallel to a logic unit between the first electrical node and the second electrical node, the first transistor may receive the enable signal as a gate input signal, and the logic unit may receive the second input signal as an input.

The logic unit may include at least one transistor, and the second input signal may be input to a gate of the at least one transistor.

The first input signal may be a feedback signal corresponding to a signal of the first electrical node.

The pre-charge circuit may include first and second logic circuits, a latch circuit, and second and third transistors, and the enable signal and the first input signal may be input into the first logic circuit, an output of the first logic circuit may be latched by the latch circuit in response to a clock signal, the clock signal and an output of the latch circuit may be input to the second logic circuit, the second transistor may pre-charge the first electrical node in response to an output of the second logic circuit, and the third transistor may discharge the second electrical node in response to the output of the second logic circuit. The latch circuit may latch the output of the first logic circuit when the clock signal may be a low level.

The evaluation circuit may include a latch circuit, and an inverter. The latch circuit may latch the enable signal in response to the clock signal, the first transistor may receive the latched enable signal, and the inverter may receive a signal of the first electrical node and may output the domino logic block output signal.

The method may also include latching the signal of the first electrical node. The signal of the first electrical node may be latched in response to the clock signal, and the latched signal may be output as the first input signal.

The signal output from the latch circuit to be input to the pre-charging circuit as the first input signal may be delayed.

BRIEF DESCRIPTION OF THE DRAWINGS

The accompanying drawings are included to provide a further understanding of the general inventive concept, and are incorporated in and constitute a part of this specification. The drawings illustrate exemplary embodiments of the general inventive concept and, together with the description, serve to explain principles of the general inventive concept. In the figures.

DETAILED DESCRIPTION OF THE EMBODIMENTS

Preferred embodiments of the general inventive concept will be described below in more detail with reference to the accompanying drawings. The embodiments of the general inventive concept may, however, be embodied in different forms and should not be constructed as limited to the embodiments set forth herein. Rather, these embodiments are provided so that this disclosure will be thorough and complete, and will fully convey the scope of the general inventive concept to those skilled in the art. Like numbers refer to like elements throughout.

Figure 1:
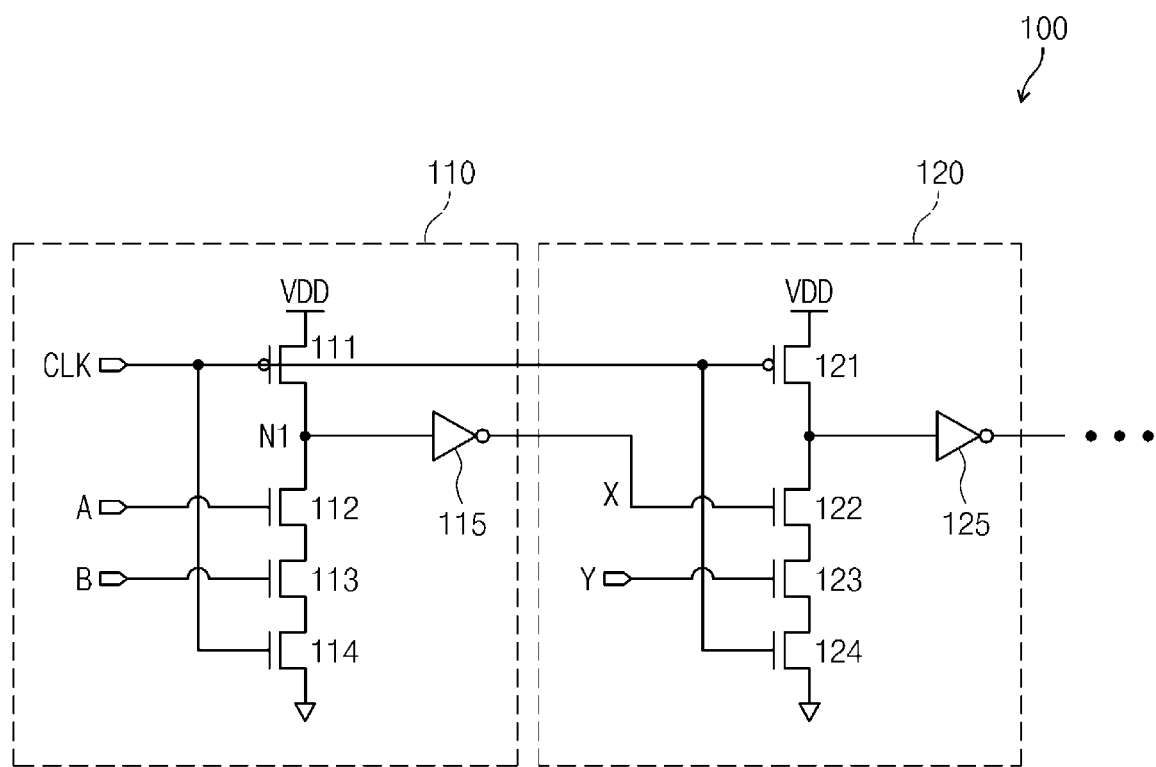
FIG. 1 is a drawing illustrating a general domino logic circuit.

FIG. 1 is a drawing illustrating a general domino logic circuit.

Referring to FIG. 1, a domino logic circuit 100 includes a plurality of domino logic blocks 110 and 120. The domino logic block 110 includes transistors 111 through 114 serially connected between a power supply voltage (VDD) and a ground voltage, and one inverter 115. The domino logic block 120 includes transistors 121 through 124 serially connected between a power supply voltage (VDD) and a ground voltage, and one inverter 125.

A PMOS transistor 111 connected between the power supply voltage (VDD) and a node (N1) precharges the node (N1) in response to a clock signal (CLK). The NMOS transistors 112 through 114 are serially and sequentially connected between the node (N1) and the ground voltage. Gates of the NMOS transistors 112 and 113 are connected to input signals (A, B) respectively. Thus, the NMOS transistors 112 and 113 perform a pull-down logic operation on the input signals (A, B) respectively. The NMOS transistor 114 performs a function of an evaluation in response to a clock signal (CLK). Specifically, when the NMOS transistor 114 is on, a current may pass source-to-drain through the resistor depending on the states of the NMOS transistors 112, 113. Thus, by turning on the NMOS transistor 114, the NMOS transistors 112, 113, and by extension the input signals A, B, may be evaluated. The inverter 115 inverts a signal of node N1 to output the inverted signal to the next stage domino logic block 120.

The domino logic block 120 has the same construction as the previous stage domino logic block 110 and receives a signal outputted from the inverter 115 as an input signal (X). In this manner, the domino logic blocks 110 and 120 share the same clock signal (CLK) and perform a pre-charge operation and a logic evaluation.

The domino logic blocks 110 and 120 pre-charge the node N1 and a node N2 respectively while the clock signal (CLK) is a low level. That is, as the PMOS transistors 111 and 121 are turned on in response to the low level clock signal (CLK), the nodes (N1, N2) are pre-charged to a high level (i.e., logic '1'). If the nodes (N1, N2) are pre-charged to a high level, the inverters 115 and 125 output a signal of a low level (i.e., logic '0').

Subsequently, the clock signal (CLK) transits to a high level, and then a logic evaluation section begins. As the clock signal (CLK) becomes a high level, the transistors 111 and 121 are turned off and the NMOS transistors 114 and 124 are turned on. At this time, according to the input signals (A, B), a voltage level of the node N1 is maintained in a high level or transits to a low level and an output of the inverter 115 is propagated as an input signal (X) of a next stage. A level of an output signal of the inverter 125 is determined by the input signals (A, B). In this manner, while the clock signal (CLK) is a high level, a signal outputted from the domino logic block 110 is successively propagated into next domino logic blocks. Since an output signal with respect to the input signal inputted in a plurality of domino logic blocks can be obtained during one cycle of the clock signal (CLK), the domino logic circuit is widely used in a chip design for a high speed operation.

Figure 2:
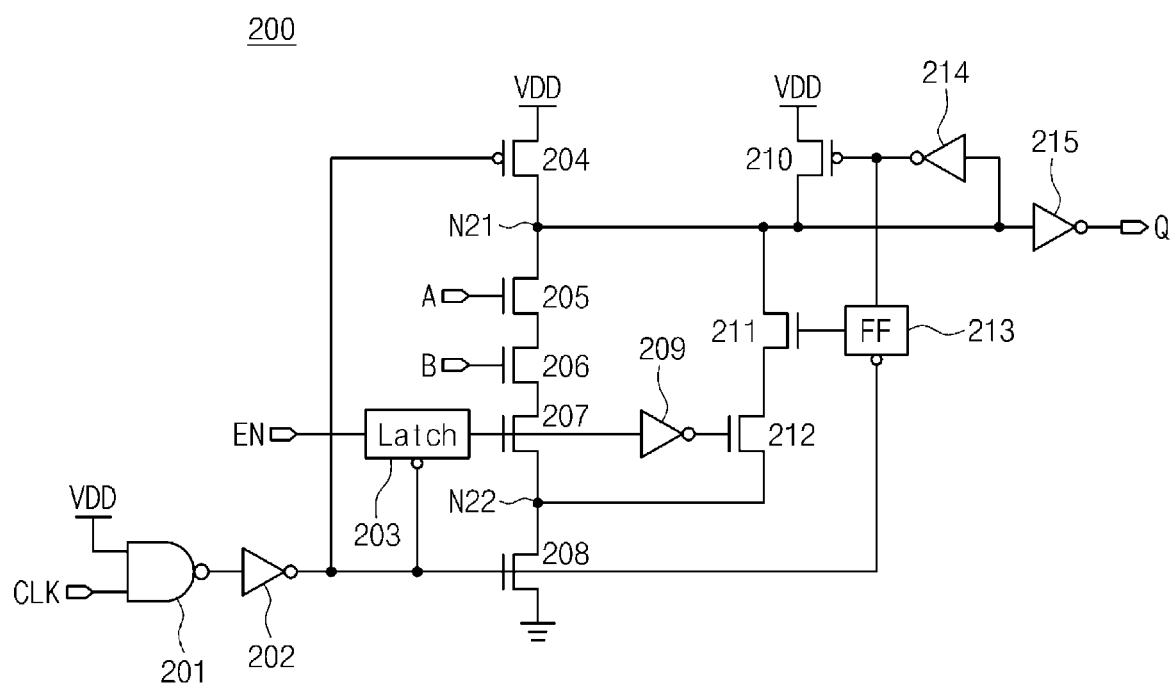
FIG. 2 is a drawing illustrating a domino logic block in accordance with an embodiment of the general inventive concept.

FIG. 2 is a drawing illustrating a domino logic block related to the general inventive concept.

Referring to FIG. 2, a domino logic block 200 includes PMOS transistors 204 and 210, NMOS transistors 205 through 212, a NAND gate 201, inverters 202, 214 and 215, a flip flop 213 and a latch 203.

The NAND gate 201 receives a power supply voltage (VDD) and a clock signal (CLK). The inverter 202 inverts an output of the NAND gate 201. The PMOS transistor 204 is connected between the power supply voltage (VDD) and a node N21 and is controlled by an output of the inverter 202. The NMOS transistors 205 through 208 are serially and sequentially connected between a node (N21) and the ground voltage. Gates of the transistors 205 and 206 are connected to the input signals (A, B) respectively. An enable signal (EN) is applied to a gate of the transistor 207 and an inverter 209 through the latch 203. The transistors 210, 211 and 212 are serially and sequentially connected between a power supply voltage and a node (N22). The node (N22) is a connection node of the transistors 207 and 208. An inverter of the inverter 214 is connected to the node (N21). The PMOS transistor 210 is connected between the power supply voltage and the node (N21) and is controlled by an output of the inverter 214. The flip flop 213 is synchronized with an output of the inverter 202 to propagate an output of the inverter 214 to a gate of the NMOS transistor 211. A gate of the NMOS transistor 212 is connected to an output of the inverter 209. The inverter 215 inverts an output of the node (N21) to output an output signal (Q). An output of the inverter 215 is propagated to a next stage domino logic block.

The domino logic block 200 having the structure described above operates as follows.

When the enable signal (EN) is a high level, a result of combinations of the input signals (A, B) is outputted as an output signal (Q) in response to the clock signal (CLK). The NMOS transistor 207 becomes turned on and the NMOS transistor 208 becomes turned off. If the clock signal (CLK) is a low level, the PMOS transistor 204 becomes turned on and the NMOS transistor 208 is turned off, so the node (N21) is pre-charged. If the clock signal (CLK) transits to a high level, the PMOS transistor 204 becomes turned off and the NMOS transistor 208 becomes turned on, so a voltage level of the node (N21) is set in a high level or set in a low level according to combinations of the input signals (A, B). Since the NMOS transistor 212 is turned off, a signal of node (N21) is outputted as an output signal (Q) through the inverter 215.

When the enable signal (EN) is a low level, the output signal (Q) maintains the level of the output signal (Q) of previous clock cycle. The NMOS transistor 207 becomes turned off and the NMOS transistor 212 become turned on. At this time, the clock signal (CLK) is a low level, the PMOS transistor 204 becomes turned on and the NMOS transistor 208 becomes turned off, so the node (N21) is pre-charged. Also, when the clock signal (CLK) is a low level, the flip flop 213 propagates an output of the inverter 214 to a gate of the NMOS transistor 211. For example, when the output signal (Q) is a low level in a previous clock cycle, an output of the flip flop 213 becomes a low level because an output of the inverter 214 is also a low level. When the output signal (Q) is a high level in a previous clock cycle, an output of the flip flop 213 becomes a high level. If the clock signal (CLK) transits to a high level, a voltage level of the node (N21) is determined by a value latched to the flip flop 213 because the PMOS transistor 204 becomes turned off and the NMOS transistor 208 becomes turned on. That is, if the output signal (Q) of a previous clock cycle is a low level, the PMOS transistor 211 becomes turned off to maintain a voltage level of the node (N21) in a high level and as a result, the output signal (Q) maintains a low level. If the output signal (Q) of a previous clock cycle is a high level, the PMOS transistor 211 becomes turned on to maintain a voltage level of the node (N21) in a high level and as a result, the output signal (Q) maintains a high level.

The domino logic block 200 outputs an output signal (Q) according to combinations of the input signals (A, B) in response to the clock signal (CLK) while the enable signal (EN) is a high level. Also, since the domino logic block 200 maintains a level of an output signal (Q) of a previous clock cycle while the enable signal (EN) is a low level, a function of data hold is accomplished.

The domino logic block 200 shown in FIG. 2 can perform a function of data hold in response to the enable signal (EN) but has several problems. Since the NMOS transistor 207 is serially connected to the input transistors 205 and 206, an evaluation time with respect to the input signals (A, B) is delayed and similarly, since the NMOS transistor 212 is serially connected to the input transistor 211, an evaluation time with respect to the output signal (Q) is delayed. Also, if an operation voltage of the domino logic block 200 becomes low, the output signal (Q) may be distorted by threshold voltages of the NMOS transistors 207 and 212. A domino logic shown in FIG. 3 is provided to solve the problems of a degradation of an operation speed and data stability of the domino logic 200 shown in FIG. 2.

Figure 3:
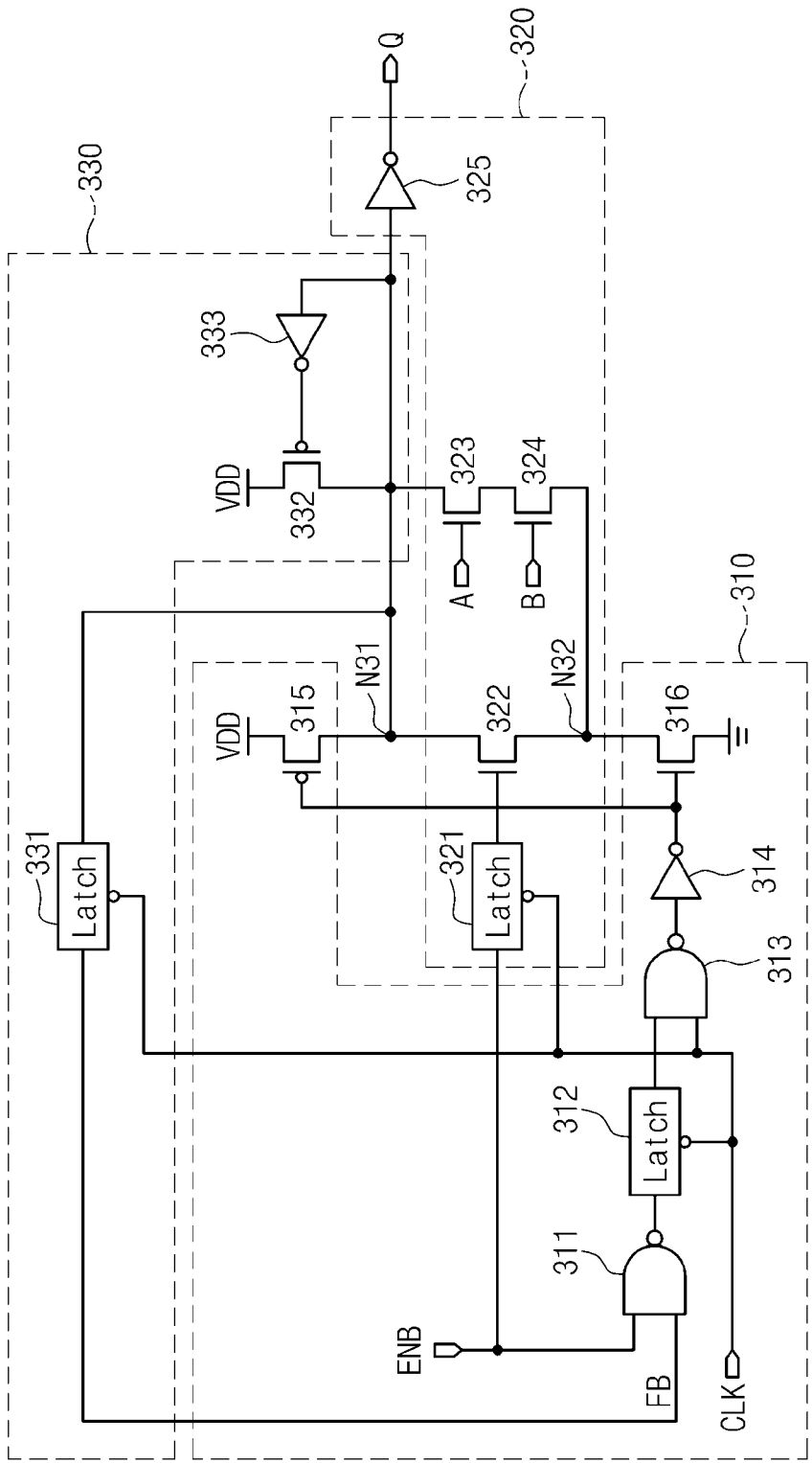
FIG. 3 is a drawing illustrating a domino logic block in accordance with another embodiment of the general inventive concept.

FIG. 3 is a drawing illustrating a domino logic block in accordance with an embodiment of the general inventive concept.

Referring to FIG. 3, a domino logic block 300 includes a pre-charge circuit 310, an evaluation circuit 320 and a feedback circuit 330.

The pre-charge circuit 310 includes NAND gates 311 and 313, a latch 312, an inverter 314, a PMOS transistor 315 and a NMOS transistor 316. The pre-charge circuit 310 receives a clock signal (CLK), an enable signal (ENB) and a feedback signal (FB), precharges a first node (N31) in response to the clock signal (CLK) and the enable signal (EN) and propagates the feedback signal (FB) to a second node (N32). The evaluation circuit 320 includes a latch 321, NMOS transistors 322, 323 and 324, and an inverter 325. The evaluation circuit 320 propagates any one of the input signals (A, B) and the feedback signal (FB) propagated to the second node (N32) to an output in response to the clock signal (CLK) and the enable signal (EN). The feedback circuit 330 includes a latch 331, a PMOS transistor 332 and an inverter 333. The feedback circuit 330 outputs a signal of the first node (N31) as the feedback signal (FB).

A specific operation of the domino logic block 300 shown in FIG. 3 is as follows. When the enable signal (ENB) is a low level, an output of the NAND gate 311 is a high level regardless of the feedback signal (FB). When the clock signal (CLK) is a low level, an output of the NAND gate 311 is latched to the latch 312. Since a signal outputted through the NAND gate 311 and the inverter 314 is a low level while the clock signal (CLK) is a low level, the PMOS transistor 315 becomes turned on and the NMOS transistor 316 becomes turned off. As a result, the first node (N31) is pre-charged. While the clock signal (CLK) is a low level, the enable signal (ENB) of a low level is latched to the latch 321, so the NMOS transistor 322 is turned off. After that, if the clock signal (CLK) transits to a high level, the PMOS transistor 315 becomes turned off and since even though the NMOS transistor 316 becomes turned on, the NMOS transistor 322 maintains a turn-off state, a voltage level of the first node (N31) is not discharged through the transistors 322 and 326. Thus, a voltage level of the first node (N31) is determined according to combinations of the input signals (A, B). In this embodiment, the input signals (A, B) are inputted into gates of the NMOS transistors 323 and 324 serially connected between the first node (N31) and the second node (N32) but the number of the input signals and combinations of the input signals may be variously changed. In FIG. 3, when all of the input signals (A, B) are high levels, the output signal (Q) becomes a high level. Also, when at least one of the input signals (A, B) is a low level, the output signal (Q) becomes a low level.

A signal level of the first node (N31) is maintained by the inverter 333 and the PMOS transistor 332. For example, when a signal level of the first node (N31) is high, an output of the inverter 333 becomes low to turn on the PMOS transistor 332. As a result, the signal level of the first node (N31) is maintained in a high level. When a signal level of the first node (N31) is low, an output of the inverter 333 becomes high to turn off the PMOS transistor 332. As a result, the signal level of the first node (N31) is maintained in a low level. Also, the signal level of the first node (N31) is latched to the latch 331 in response to the clock signal (CLK) of a low level and is outputted as the feedback signal (FB).

If the enable signal is a high level, the signal level of the output signal (Q) is determined by the feedback signal (FB). While the clock signal (CLK) is a low level, the PMOS transistor 315 is turned on and the NMOS transistor 316 is turned off to pre-charge the first node (N31). Also, while the clock signal (CLK) is a low level, the enable signal (ENB) of a low level is latched to the latch 321 to turn on the NMOS transistor 322. If the clock signal (CLK) transits to a high level, the PMOS transistor 315 and the NMOS transistor 316 are turned on or turned off according to a level of the feedback signal (FB). For example, if the feedback signal (FB) is a high level, an output of the NAND gate 311 is a low level, so an output of the inverter 314 becomes a low level to hold turn-on state of the PMOS transistor 315 and turn-off state of the NMOS transistor 316. Thus, the first node (N31) is maintained in a pre-charged high level and the output signal (Q) is maintained in a low level. If the feedback signal (FB) is a low level, an output of the NAND gate 311 is a high level and an output of the inverter 314 is a high level. Thus, the PMOS transistor 315 becomes turned off and the NMOS transistor 316 becomes turned on. Since the NMOS transistor 322 is maintained in turn-on state by the enable signal (ENB) of a high level latched to the latch 321, a current path between the first node (N31) and a ground voltage is formed through the NMOS transistors 322 and 316 to discharge the first node (N31) to a low level. Thus, the output signal (Q) outputted through the inverter 325 is a high level. If the enable signal (ENB) is a high level, the output signal (Q) is maintained in the signal level of a previous clock cycle.

The domino logic block 300 shown in FIG. 3 performs a multiplexer function. That is, the enable signal (ENB) is a select signal of a multiplexer, a logic combination of the input signals (A, B) is a first input and the feedback signal is a second input. For instance, when the enable signal (ENB) is a low level, a logic combination of the input signals (A, B) is outputted as the output signal (Q) and when the enable signal (ENB) is a high level, the feedback signal is outputted as the output signal (Q).

In a domino logic circuit in which domino logic blocks are sequentially connected, the domino logic block 300 illustrated in FIG. 3 may be used to hold that an output signal of a domino logic block of previous stage is propagated to a next stage.

Figure 4:
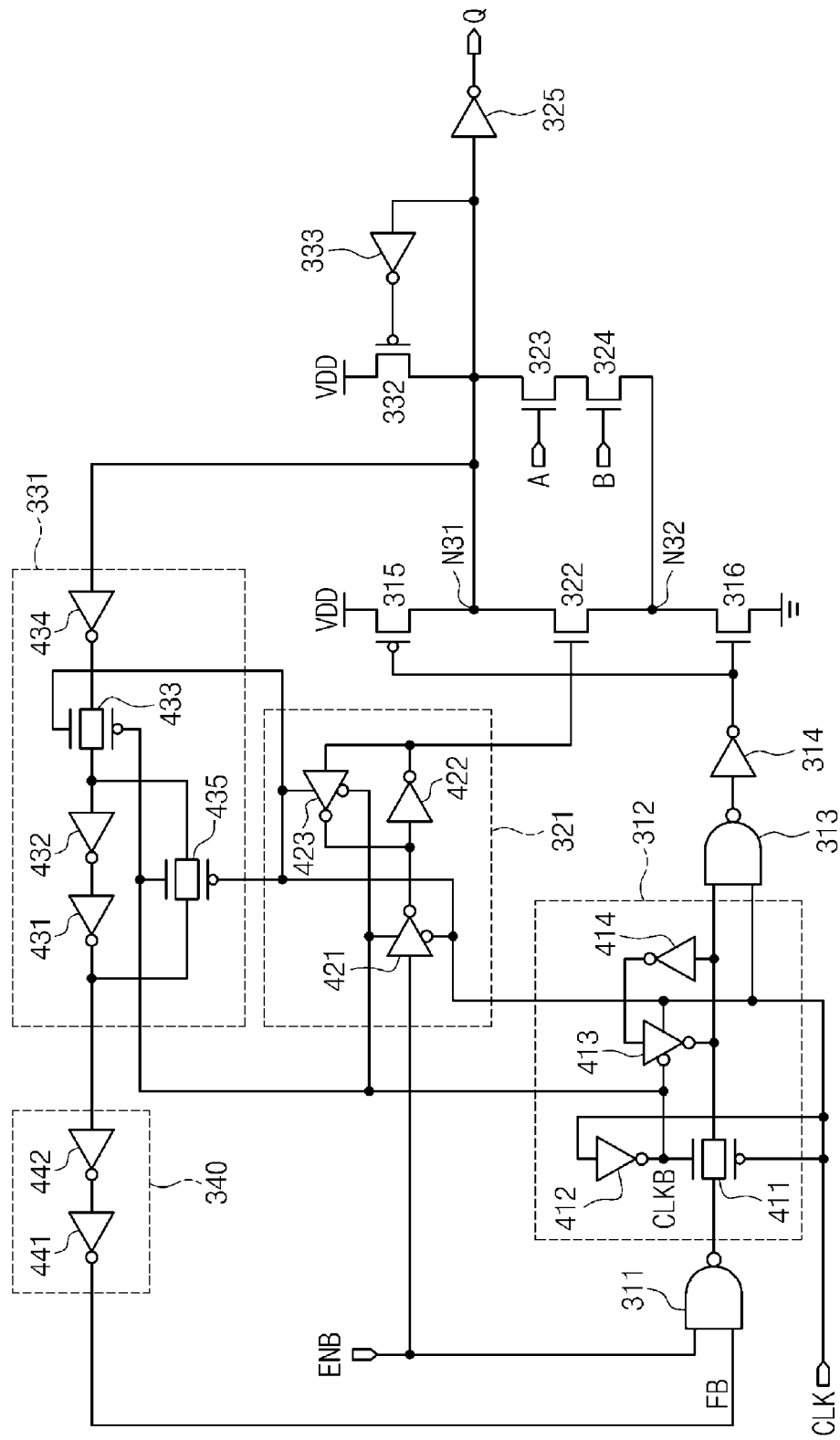
FIG. 4 is a drawing illustrating a domino logic block in accordance with still another embodiment of the general inventive concept.

FIG. 4 is a drawing illustrating a domino logic block in accordance with still another embodiment of the general inventive concept. The domino logic block 400 shown in FIG. 4 has the construction similar to the domino logic block shown in FIG. 3 and shows constructions of latches 312, 321 and 331.

Referring to FIG. 4, the latch 321 includes a transmission gate 411 and inverters 412, 413 and 414. The inverter 412 inverts a clock signal (CLK) to output the inverted clock signal (CLKB). The transmission gate 411 propagates a signal outputted from a NAND gate 311 to a NAND gate 313 in response to the clock signal (CLK) and the inverted clock signal (CLKB). When the clock signal (CLK) is a low level, the transmission gate 411 propagates a signal outputted from the NAND gate 311 to the NAND gate 313. Inverters 413 and 414 are connected so that a signal level outputted from the transmission gate 411 is maintained.

The latch 321 includes inverters 421, 422 and 423. The inverter 421 receives an enable signal (ENB). The inverter 422 is connected between the inverter 421 and a gate of a NAND transistor 322. The inverter 423 is connected between the NMOS transistor 322 and the inverter 421. The inverters 422 and 423 operate so that a level of a signal which is outputted from the inverter 421, and then inputted into a gate of the NMOS transistor 322 is maintained.

The latch 331 includes inverters 431, 432 and 434 and transmission gates 433 and 435. The inverter 434 receives an output from an inverter 333. The transmission gate 433 propagates an output of the inverter 434 into the inverter 432 in response to the clock signal (CLK) and the inverted clock signal (CLKB). The inverter 431 inverts a signal inputted from the inverter 432 to output the inverted signal. The transmission gate 435 provides an output of the inverter 431 to an input of the inverter 432. The circuit constructions of the latches 312, 321 and 331 shown in FIG. 4 may be variously changed.

The domino logic block 400 further includes a buffer circuit 340 which is not in the domino logic block 300 in FIG. 3. The buffer circuit 340 includes inverters 441 and 442. The buffer circuit 340 delays the feedback signal (FB) to input the delayed feedback signal to the NAND gate 311. The number of inverters in the buffer 340 may be changed to control a delay time of the feedback signal (FB).

Figure 5:
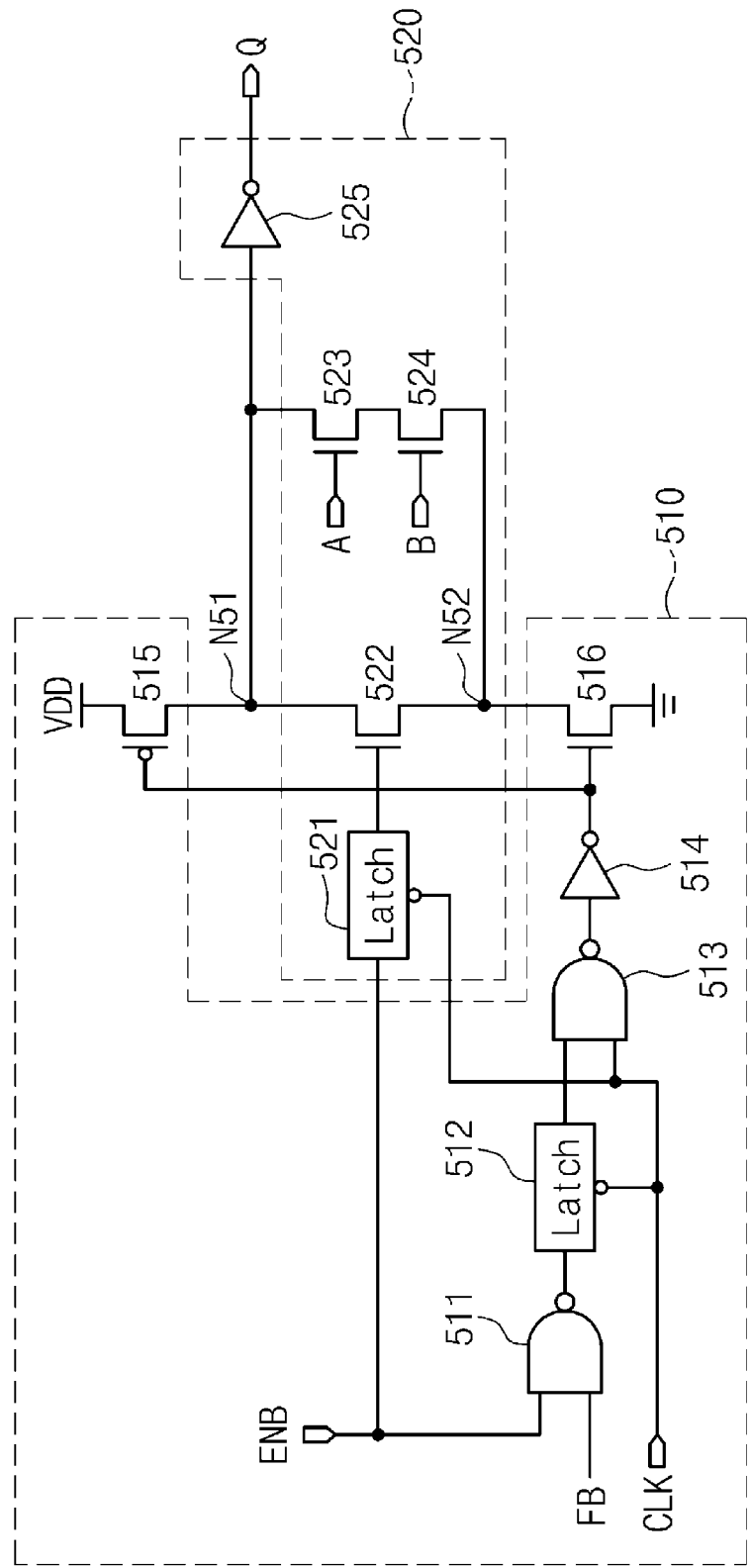
FIG. 5 is a drawing illustrating a domino logic block in accordance with yet another embodiment of the general inventive concept.

FIG. 5 is a drawing illustrating a domino logic block in accordance with yet another embodiment of the general inventive concept.

The domino logic block 300 of FIG. 3 latches a signal of the first node (N31) to provide the latched signal as the feedback signal but a domino logic block 500 of FIG. 5 receives the feedback signal (FB) by a separate signal without feedback of a signal of a first node (N51).

Constructions and operations of a pre-charge circuit 510 and an evaluation circuit 520 of the domino logic block 500 are similar to the pre-charge circuit 310 and the evaluation circuit 320 of the domino logic block 300 shown in FIG. 3.

When an enable signal (ENB) is a low level, the domino logic block 500 outputs an output signal (Q) according to a logic combination of the input signals (A, B). When an enable signal (ENB) is a high level, a level of the output signal (Q) is determined by the feedback signal (FB).

Figure 6:
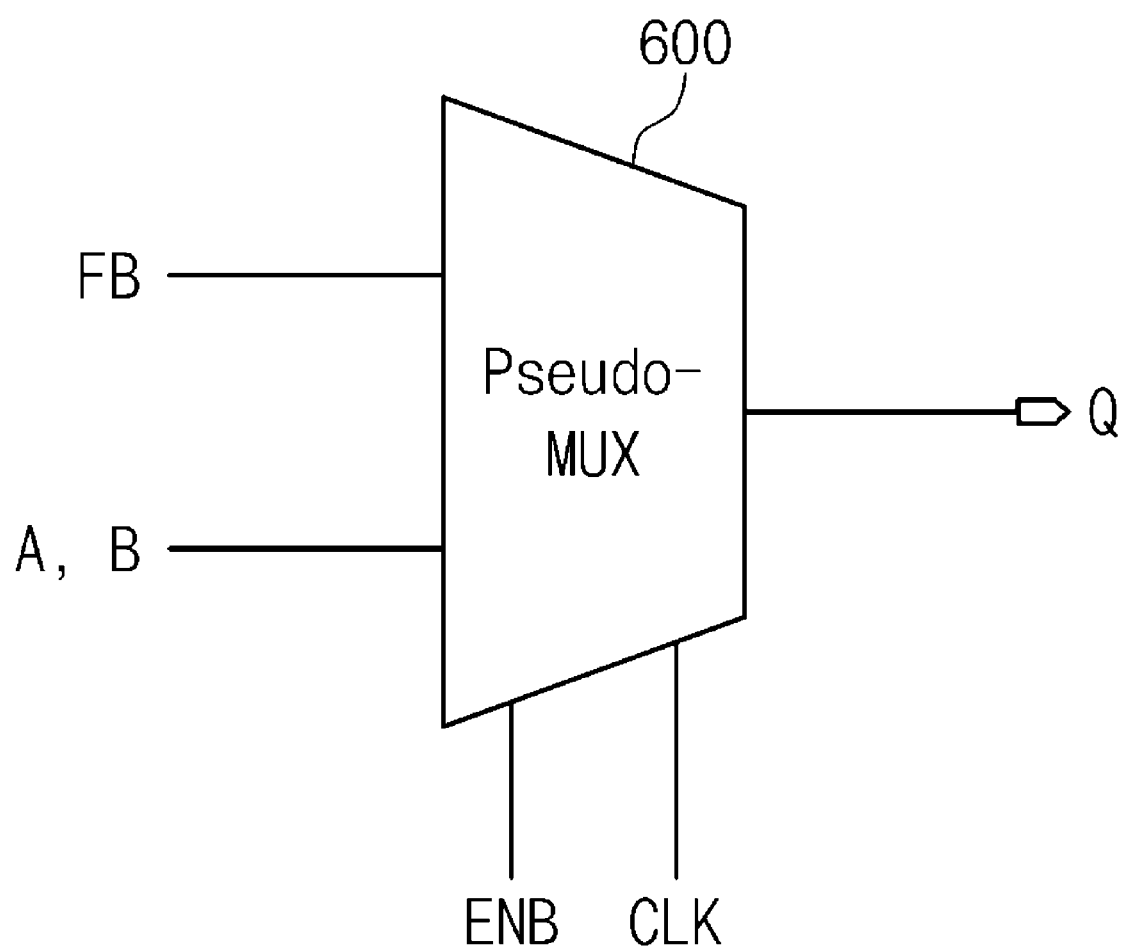
FIG. 6 is a drawing illustrating an illustration embodying the logic domino block shown in FIG. 5 in a pseudo multiplexer.

FIG. 6 is a drawing illustrating an illustration embodying the logic domino block shown in FIG. 5 in a pseudo multiplexer.

Referring to FIG. 6, a pseudo multiplexer 600 receives a feedback signal (FB) and input signals (A, B) and outputs any one of the feedback signal (FB) and the input signals (A, B) as an output signal (Q) in response to an enable signal (ENB) and a clock signal (CLK). The number of the input signals may be variously changed. Also, when the input signals (A, B) are selected in response to the enable signal (ENB) and the clock signal (CLK), an output signal (Q) may be outputted according to a logic combination of the input signals (A, B).

Figure 7:
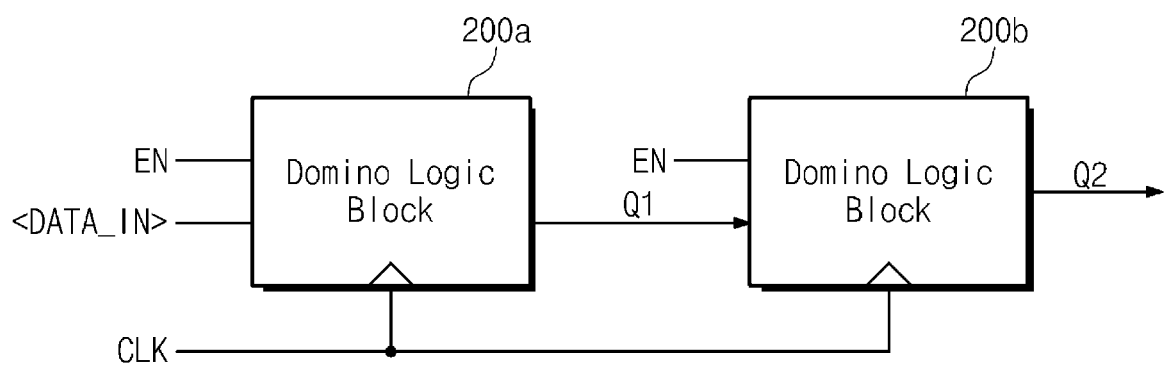
FIG. 7 illustrates two domino logic blocks connected in series according to the present general inventive concept.

FIG. 7 illustrates two domino logic blocks connected in series. At least one of the domino logic blocks 200a and 200b may have a logic structure similar to that of any one of the domino logic blocks of FIGS. 2-5, for example. The first domino logic block 200a receives an enable signal EN and data inputs <DATA_IN> such as the data input signals A and B of FIG. 2. The first domino logic block also receives the clock signal CLK. The output $Q_1$ of the first domino logic block 200a may be connected to one of the data inputs (corresponding to inputs A, B of FIG. 2) of the second domino logic block 200b, in a manner similar to that depicted in FIG. 1. The second domino logic block 200b may also receive the enable signal EN and the clock signal CLK, and may output a second output signal $Q_2$ based on the evaluation of the first output signal $Q_1$ and one or more data inputs. In other words, the structures of at least one of the two domino logic blocks 200a and 200b may be similar to those disclosed in FIGS. 2-5, and the domino logic blocks 200a and 200b may be connected in series by connecting the output $Q_1$ of one domino logic block 200a to an input of the other domino logic block 200b.

The above-disclosed subject matter is to be considered illustrative, and not restrictive, and the appended claims are intended to cover all such modifications, enhancements, and other embodiments, which fall within the true spirit and scope of the general inventive concept. Thus, to the maximum extent allowed by law, the scope of the general inventive concept is to be determined by the broadest permissible interpretation of the following claims and their equivalents, and shall not be restricted or limited by the foregoing detailed description.

What is claimed is:

1. A domino logic block comprising:
 a pre-charge circuit to pre-charge a first electrical node and to discharge a second electrical node in response to a clock signal, an enable signal and a first input signal; and
 an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
 wherein the first transistor receives the enable signal as a gate input signal,
 the logic unit receives the second input signal as an input, and
 the pre-charge circuit comprises:
  a first logic circuit to receive the enable signal and the first input signal;
  a latch circuit to latch an output of the first logic circuit in response to the clock signal;
  a second logic circuit to receive the clock signal and an output of the latch circuit;
  a second transistor to pre-charge the first electrical node in response to an output of the second logic circuit; and
  a third transistor to discharge the second electrical node in response to the output of the second logic circuit.

2. The domino logic block of claim 1, wherein:
 the logic unit includes at least one transistor, and
 the second input signal is connected to a gate of the at least one transistor.

3. The domino logic block of claim 1, wherein:
 the first input signal is a feedback signal corresponding to a signal of the first electrical node.

4. The domino logic block of claim 1, wherein the first logic circuit comprises a NAND gate and the second logic circuit is comprised of an AND gate.

5. The domino logic block of claim 1, wherein:
the latch circuit latches the output of the first logic circuit when the clock signal is a low level,
the second transistor is a PMOS transistor, and
the third transistor is an NMOS transistor.

6. The domino logic block of claim 1, wherein the evaluation circuit comprises:
a latch circuit to latch the enable signal in response to the clock signal;
the first transistor connected to an output of the latch circuit to receive the latched enable signal;
the logic unit; and
an inverter to receive a signal of the first electrical node and to output the domino logic block output signal.

7. The domino logic block of claim 6, wherein:
the latch circuit latches the enable signal when the clock signal is a low level, and
the first transistor is an NMOS transistor.

8. The domino logic block of claim 6, wherein the second input signal comprises at least two second input signals, and
the logic unit comprises a logic combination circuit to perform a logic function on the at least two second input signals.

9. The domino logic block of claim 1, further comprising a feedback circuit to output a signal of the first electrical node of a previous cycle of the clock signal as the first input signal.

10. The domino logic block of claim 9, wherein the feedback circuit comprises a latch circuit to latch the signal of the first electrical node.

11. The domino logic block of claim 10, wherein the latch circuit latches the signal of the first electrical node in response to the clock signal and outputs the latched signal as the first input signal.

12. The domino logic block of claim 11, wherein the feedback circuit further comprises a buffer circuit connected to the output of the latch circuit to delay the signal output from the latch circuit.

13. A domino logic circuit comprising:
a plurality of domino logic blocks sequentially connected to one another, wherein at least one of the plurality of domino logic blocks comprises:
a pre-charge circuit to pre-charge a first electrical node and to discharge a second electrical node in response to a clock signal, an enable signal, and a first input signal; and
an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
wherein the first transistor receives the enable signal as a gate input signal,
the logic unit receives the second input signal as an input, and
the first input signal is a feedback signal corresponding to a signal of the first electrical node of a previous cycle of the clock signal.

14. The domino logic of claim 13, wherein the second input signal is coupled to the output signal of another domino logic block of the plurality of domino logic blocks.

15. A system-on-chip, comprising:
a CPU core;
supporting logic; and
memory,
wherein at least one of the CPU core, the supporting logic, and the memory includes a domino logic circuit, comprising:
a pre-charge circuit to pre-charge a first electrical node and to discharge a second electrical node in response to a clock signal, an enable signal, and a first input signal; and
an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
wherein the first transistor receives the enable signal as a gate input signal,
the logic unit receives the second input signal as an input, and
the first input signal is a feedback signal corresponding to a signal of the first electrical node of a previous cycle of the clock signal.

16. The system-on-chip according to claim 15, wherein:
only the CPU core includes the domino logic circuit.

17. A method of selectively outputting a signal from a domino logic circuit, the method comprising:
pre-charging a first electrical node and discharging a second electrical node in response to a clock signal, an enable signal, and a first input signal;
inputting the clock signal, the enable signal, and a second input signal into an evaluation circuit; and
based on the clock signal and the enable signal, outputting from the evaluation circuit a signal corresponding to one of the first input signal and the second input signal,
wherein the evaluation circuit comprises a first transistor connected in parallel to a logic unit between the first electrical node and the second electrical node,
the first transistor receives the enable signal as a gate input signal,
the logic unit receives the second input signal as an input, and
the evaluation circuit further comprises:
a latch circuit; and
an inverter,
wherein the latch circuit latches the enable signal in response to the clock signal;
the first transistor receives the latched enable signal; and
the inverter receives a signal of the first electrical node and outputs the domino logic block output signal.

18. The method of claim 17, wherein:
the logic unit includes at least one transistor, and
the second input signal is input to a gate of the at least one transistor.

19. The method of claim 17, wherein the first input signal is a feedback signal corresponding to a signal of the first electrical node.

20. The method of claim 17, wherein the pre-charge circuit comprises:
first and second logic circuits;
a latch circuit; and
second and third transistors, and
the enable signal and the first input signal are input into the first logic circuit;
an output of the first logic circuit is latched by the latch circuit in response to a clock signal;
the clock signal and an output of the latch circuit are input to the second logic circuit;

the second transistor pre-charges the first electrical node in response to an output of the second logic circuit; and
the third transistor discharges the second electrical node in response to the output of the second logic circuit.

21. The method of claim 20, wherein:
the latch circuit latches the output of the first logic circuit when the clock signal is a low level.

22. The method of claim 17, wherein the latch circuit latches the enable signal when the clock signal is a low level.

23. The method of claim 17, wherein the second input signal comprises at least two second input signals, and
the logic unit is a logic combination circuit that performs a logic function on the at least two second input signals.

24. The method of claim 17, further comprising outputting from a feedback circuit a signal of the first electrical node as the first input signal.

25. The method of claim 24, further comprising latching the signal of the first electrical node.

26. The method of claim 25, wherein:
the signal of the first electrical node is latched in response to the clock signal, and
the latched signal is output as the first input signal.

27. The method of claim 26, further comprising delaying the signal output from the latch circuit to be input to the pre-charging circuit as the first input signal.

28. A domino logic block comprising:
a pre-charge circuit to pre-charge a first electrical node and to discharge a second electrical node in response to a clock signal, an enable signal and a first input signal; and
an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
wherein the first transistor receives the enable signal as a gate input signal,
the logic unit receives the second input signal as an input, and
the first input signal is a feedback signal corresponding to a signal of the first electrical node.

29. A domino logic block comprising:
a pre-charge circuit to pre-charge a first electrical node and to discharge a second electrical node in response to a clock signal, an enable signal and a first input signal; and
an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
wherein the first transistor receives the enable signal as a gate input signal,
the logic unit receives the second input signal as an input, and
the evaluation circuit comprises:
a latch circuit to latch the enable signal in response to the clock signal;
the first transistor connected to an output of the latch circuit to receive the latched enable signal;
the logic unit; and
an inverter to receive a signal of the first electrical node and to output the domino logic block output signal.

30. The domino logic block of claim 29, wherein:
the latch circuit latches the enable signal when the clock signal is a low level, and
the first transistor is an NMOS transistor.

31. The domino logic block of claim 29, wherein the second input signal comprises at least two second input signals, and
the logic unit comprises a logic combination circuit to perform a logic function on the at least two second input signals.

32. A system-on-chip, comprising:
a CPU core;
supporting logic; and
memory,
wherein at least one of the CPU core, the supporting logic, and the memory includes a domino logic circuit, comprising:
a pre-charge circuit to pre-charge a first electrical node and to discharge a second electrical node in response to a clock signal, an enable signal, and a first input signal; and
an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
wherein the first transistor receives the enable signal as a gate input signal,
the logic unit receives the second input signal as an input, and
the pre-charge circuit comprises:
a first logic circuit to receive the enable signal and the first input signal;
a latch circuit to latch an output of the first logic circuit in response to the clock signal;
a second logic circuit to receive the clock signal and an output of the latch circuit;
a second transistor to pre-charge the first electrical node in response to an output of the second logic circuit; and
a third transistor to discharge the second electrical node in response to the output of the second logic circuit.

33. A system-on-chip, comprising:
a CPU core;
supporting logic; and
memory,
wherein at least one of the CPU core, the supporting logic, and the memory includes a domino logic circuit, comprising:
a pre-charge circuit to pre-charge a first electrical node and to discharge a second electrical node in response to a clock signal, an enable signal, and a first input signal; and
an evaluation circuit comprising a first transistor connected in parallel to a logic unit between the first electrical node and the second electrical node, the evaluation circuit to output an output signal corresponding to one of the first input signal and a second input signal, the output signal of the evaluation circuit being based on the clock signal and the enable signal,
wherein the first transistor receives the enable signal as a gate input signal, the logic unit receives the second input signal as an input, and the evaluation circuit comprises:
- a latch circuit to latch the enable signal in response to the clock signal;
- the first transistor connected to an output of the latch circuit to receive the latched enable signal;
- the logic unit; and
- an inverter to receive a signal of the first electrical node and to output the domino logic block output signal.

34. A method of selectively outputting a signal from a domino logic circuit, the method comprising:
- pre-charging a first electrical node and discharging a second electrical node in response to a clock signal, an enable signal, and a first input signal;
- inputting the clock signal, the enable signal, and a second input signal into an evaluation circuit; and
- based on the clock signal and the enable signal, outputting from the evaluation circuit a signal corresponding to one of the first input signal and the second input signal,
- wherein the evaluation circuit comprises a first transistor connected in parallel to a logic unit between the first electrical node and the second electrical node,
- the first transistor receives the enable signal as a gate input signal,
- the logic unit receives the second input signal as an input, and
- the first input signal is a feedback signal corresponding to a signal of the first electrical node.

35. A method of selectively outputting a signal from a domino logic circuit, the method comprising:
- pre-charging a first electrical node and discharging a second electrical node in response to a clock signal, an enable signal, and a first input signal;
- inputting the clock signal, the enable signal, and a second input signal into an evaluation circuit; and
- based on the clock signal and the enable signal, outputting from the evaluation circuit a signal corresponding to one of the first input signal and the second input signal,
- wherein the evaluation circuit comprises a first transistor connected in parallel to a logic unit between the first electrical node and the second electrical node,
- the first transistor receives the enable signal as a gate input signal,
- the logic unit receives the second input signal as an input, and
- the pre-charge circuit comprises:
  - first and second logic circuits;
  - a latch circuit; and
  - second and third transistors, and
- the enable signal and the first input signal are input into the first logic circuit;
- an output of the first logic circuit is latched by the latch circuit in response to a clock signal;
- the clock signal and an output of the latch circuit are input to the second logic circuit;
- the second transistor pre-charges the first electrical node in response to an output of the second logic circuit; and
- the third transistor discharges the second electrical node in response to the output of the second logic circuit.

* * * * *